(12) United States Patent
Ji et al.

(10) Patent No.: US 9,275,722 B2
(45) Date of Patent: Mar. 1, 2016

(54) MEMORY DEVICE PREVENTING FAIL CAUSED BY SUCCESSIVE READ OPERATIONS AND SYSTEM INCLUDING THE SAME

(71) Applicant: SK hynix Inc., Gyeonggi-do (KR)

(72) Inventors: Jung-Hwan Ji, Gyeonggi-do (KR);
Ki-Chon Park, Gyeonggi-do (KR);
Jin-Youp Cha, Gyeonggi-do (KR);
Jin-Hee Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 141 days.

(21) Appl. No.: 14/107,881

(22) Filed: Dec. 16, 2013

(65) Prior Publication Data

US 2015/0127884 A1 May 7, 2015

(30) Foreign Application Priority Data

Nov. 5, 2013 (KR) .......................... 10-2013-0133462

(51) Int. Cl.
*G11C 7/00* (2006.01)
*G11C 11/4097* (2006.01)
*G11C 7/10* (2006.01)
*G11C 11/4096* (2006.01)

(52) U.S. Cl.
CPC ............ *G11C 11/4097* (2013.01); *G11C 7/106* (2013.01); *G11C 7/1048* (2013.01); *G11C 7/1069* (2013.01); *G11C 7/1096* (2013.01); *G11C 11/4096* (2013.01)

(58) Field of Classification Search
CPC ................... G06F 12/0246; G06F 2212/7201; G11C 16/26; G11C 16/0483
USPC ...................................... 365/189.17; 711/103
See application file for complete search history.

(56) References Cited

U.S. PATENT DOCUMENTS

| 6,175,535 B1 * | 1/2001 | Dhong et al. ................. 365/236 |
| 7,225,318 B2 | 5/2007 | Tran et al. |
| 2003/0151437 A1 * | 8/2003 | Demone ........................ 327/218 |
| 2006/0250162 A1 * | 11/2006 | Kim et al. ........................ 327/55 |

FOREIGN PATENT DOCUMENTS

| KR | 1020070002838 | 1/2007 |
| KR | 1020070036637 | 4/2007 |

\* cited by examiner

*Primary Examiner* — Han Yang
*Assistant Examiner* — Xiaochun L Chen
(74) *Attorney, Agent, or Firm* — IP & T Group LLP

(57) ABSTRACT

A memory device include a memory array, a transmitter suitable for outputting data to the outside of the memory device, and a data bus suitable for transmitting data of a selected memory cell in the memory array to the transmitter during a read operation. When successive read commands for the same memory cell are applied, data transmission from the memory array to the data bus is blocked, and data previously loaded in the data bus is outputted through the transmitter.

18 Claims, 6 Drawing Sheets

MEMORY DEVICE PREVENTING FAIL CAUSED BY SUCCESSIVE READ OPERATIONS AND SYSTEM INCLUDING THE SAME

CROSS-REFERENCE TO RELATED APPLICATIONS

The present application claims priority of Korean Patent Application No. 10-2013-0133462, filed on Nov. 5, 2013, which is incorporated herein by reference in its entirety.

BACKGROUND

1. Field

Exemplary embodiments of the present invention relate to a semiconductor design technology, and more particularly, to a memory device and a system including the same.

2. Description of the Related Art

A memory device stores data inputted from the outside, and outputs the stored data to the outside. The memory device includes a plurality of data buses formed therein, through which data are transmitted. The data buses include a global data bus and a local data bus. The global data bus serves to transmit data between a data input/output pad and memory banks and is shared by the memory banks. The local data bus is provided for each of the memory banks.

FIG. 1 is a block diagram illustrating a conventional memory device.

First, in a write operation, data inputted through a data pad DQ is loaded onto a global data bus GIO through a receiver 102. Then, the data is transferred to the vicinities of memory banks 110 and 120. When the memory bank 110 is selected, the data of the global data bus GIO is loaded onto local data bus pair LIO_B0 and LIOb_B0 of the memory bank 110 by a write driver (WTDRV) 112. Then, the data loaded in the local data bus pair LIO_B0 and LIOb_B0 is written to a memory cell selected in the memory bank 110. When the memory bank 120 is selected, the data of the global data bus GIO is loaded onto local data bus pair LIO_B1 and LIOb_B1 of the memory bank 120 by a write driver 122, and written to a memory cell selected in the memory bank 120.

Second, in a read operation, when the memory bank 110 is selected, data stored in a memory cell selected in the memory bank 110 is loaded onto the local data bus pair LIO_B0 and BIOb_B0, amplified by an I/O sense amplifier (IOSA) 111, and loaded onto the global data bus GIO. Then, the data transferred to the vicinities of the data pad DQ by the global data bus GIO is outputted to the outside of the memory device by a transmitter 101. When the memory bank 120 is selected, data stored in a memory cell selected in the memory bank 120 is outputted to the outside of the memory device through the local data bus pair LIO_B1 and LIOb_B1, an I/O sense amplifier 121, the global data bus GIO, and the transmitter 101.

FIG. 2 is a diagram for explaining a concern occurring when a read operation is successively performed on the same memory cell, in the conventional memory device shown in FIG. 1. In FIG. 2, it is assumed that an active and read operation is performed for one word line and one bit line.

Referring to FIG. 2, a word line WL is activated in response to an active command at a time point 201. When the word line WL is activated, data of a memory cell corresponding to the word line WL is loaded onto a bit line pair BL and BLb. Referring to FIG. 2, it can be seen that the level of a bit line BL becomes higher than the level of a complementary bit line BLb by charge sharing between the memory cell and the bit line pair BL and BLb. At a time point 202, a bit line sense amplifier is enabled, and a slight potential difference between the bit line pair BL and BLb is amplified by the bit line sense amplifier. Then, the bit line BL has a level corresponding to a core voltage VCORE, which is a high-level voltage used in a cell area, and the complementary bit line BLb has a level corresponding to a ground voltage VSS, which is a low-level voltage used in the cell area.

Time points 203, 204, and 205 indicate sections in which read operations are performed by read commands. During the sections in which the read operations are performed, the voltage levels of the bit line BL and the complementary bit line BLb are transferred to the local data bus pair LIO and LIOb. That is, the local data bus pair LIO and LIOb is driven by the bit line pair BL and BLb. Thus, the voltage level of the bit line BL momentarily decreases, and the voltage level of the complementary bit One BLb momentarily increases. The voltage levels of the bit line BL and the complementary bit One BLb, which are momentarily decreased and increased, are recovered to the original levels by the bit line sense amplifier. When the read operations 203, 204, and 205 are successively performed as illustrated in FIG. 2, the voltage levels of the bit line pair BL and BLb may not be completely recovered, but a voltage difference between the bit line pair BL and BLb may gradually decrease. Then, as indicated by reference numeral 206, the voltage difference between the bit line BL and the complementary bit line BLb may decrease to cause a fail in which the voltage levels of the bit line and the complementary bit line are changed to each other.

During the operation of the memory device, successive read operations on the same memory cell may occur frequently. Thus, a technique capable of preventing a fail caused by successive read operations on the same memory cell is in demand.

SUMMARY

Various embodiments are directed to a memory device that may prevent a fail even when successive read operations are performed on the same memory cell, and a system including the same.

In an embodiment of the present invention, a memory device may include a memory array, a transmitter suitable for outputting data to the outside of the memory device, and a data bus suitable for transmitting data of a selected memory cell in the memory array to the transmitter during a read operation. When successive read command for the same memory cell are applied, data transmission from the memory array to the data bus is blocked, and data previously loaded in the data bus is outputted through the transmitter.

In an embodiment of the present invention, a system may include a memory controller and a memory device. The memory controller transmits a read command and an address corresponding to the read command to the memory device. The memory device may include a memory array, a transmitter suitable for outputting data to the memory controller, and a data bus suitable for transmitting data of a selected memory cell in the memory array to the transmitter during a read operation by the read command. When the memory controller successively applies read commands with the same address, data transmission from the memory array to the data bus is blocked, and data loaded in the data bus is transmitted through the transmitter.

In an embodiment of the present invention, a memory device may include a memory array with memory banks each including a plurality of memory cells, local data buses corresponding to the respective memory banks, a transmitter suitable for outputting data to the outside of the memory device, and a global data bus suitable for transmitting data of a local data bus corresponding to a selected memory bank to the transmitter, during a read operation, a blocking signal generation unit suitable for generating a blocking signal denoting a current address is equal to a previous address when two successive read commands are applied, and a data transmission control unit suitable for controlling data transmission based on the current address and the blocking signal. When the blocking signal is activated, the data loaded previously in the global data bus is transmitted to the transmitter as a read data during a read operation, while blocking data of the selected memory bank from being loaded onto the corresponding local data bus.

DETAILED DESCRIPTION

Figure 1:
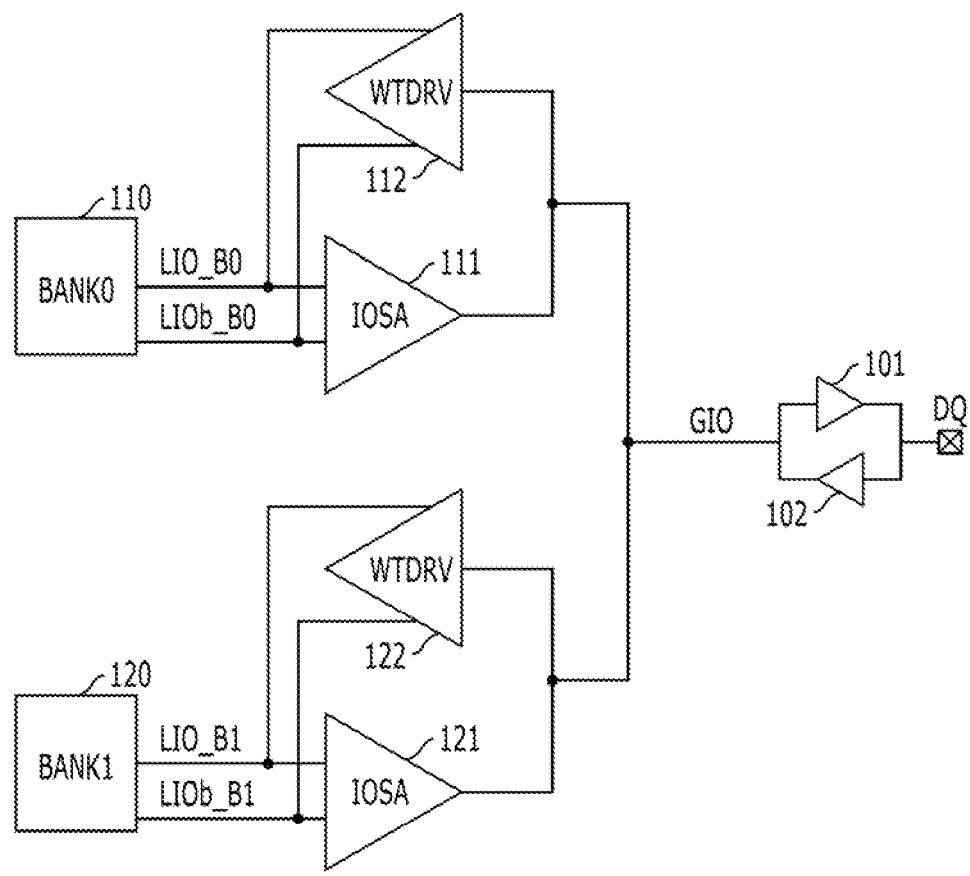
FIG. 1 is a block diagram illustrating a conventional memory device.
Figure 2:
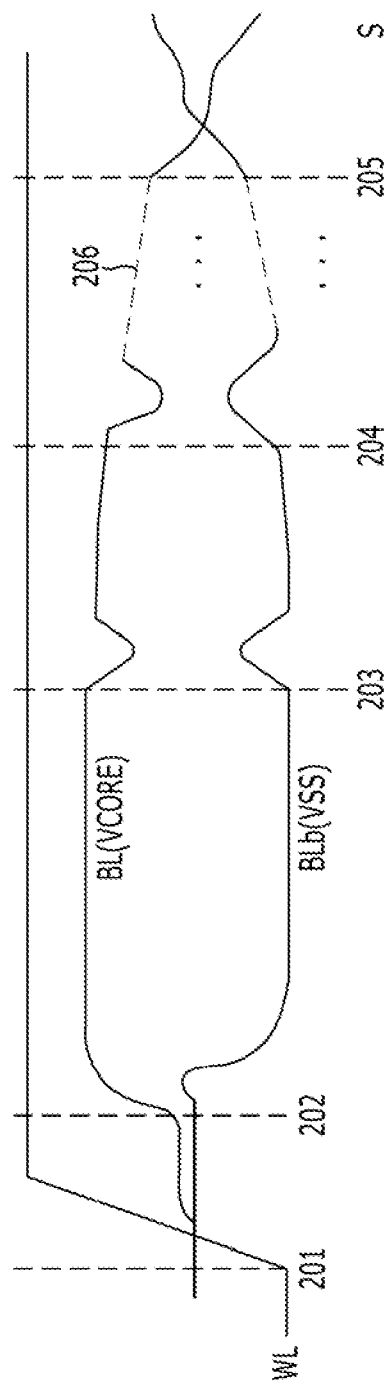
FIG. 2 is a diagram for explaining a concern occurring when a read operation is successively performed on the same memory cell, in the conventional memory device shown in FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. Throughout the disclosure, reference numerals correspond directly to the like parts in the various figures and embodiments of the present invention. It is also noted that in this specification, "connected/coupled" refers to one component, not only directly coupling another component but also indirectly coupling another component through an intermediate component. In addition a singular form may include a plural form as long as it is not specifically mentioned in a sentence.

Figure 3:
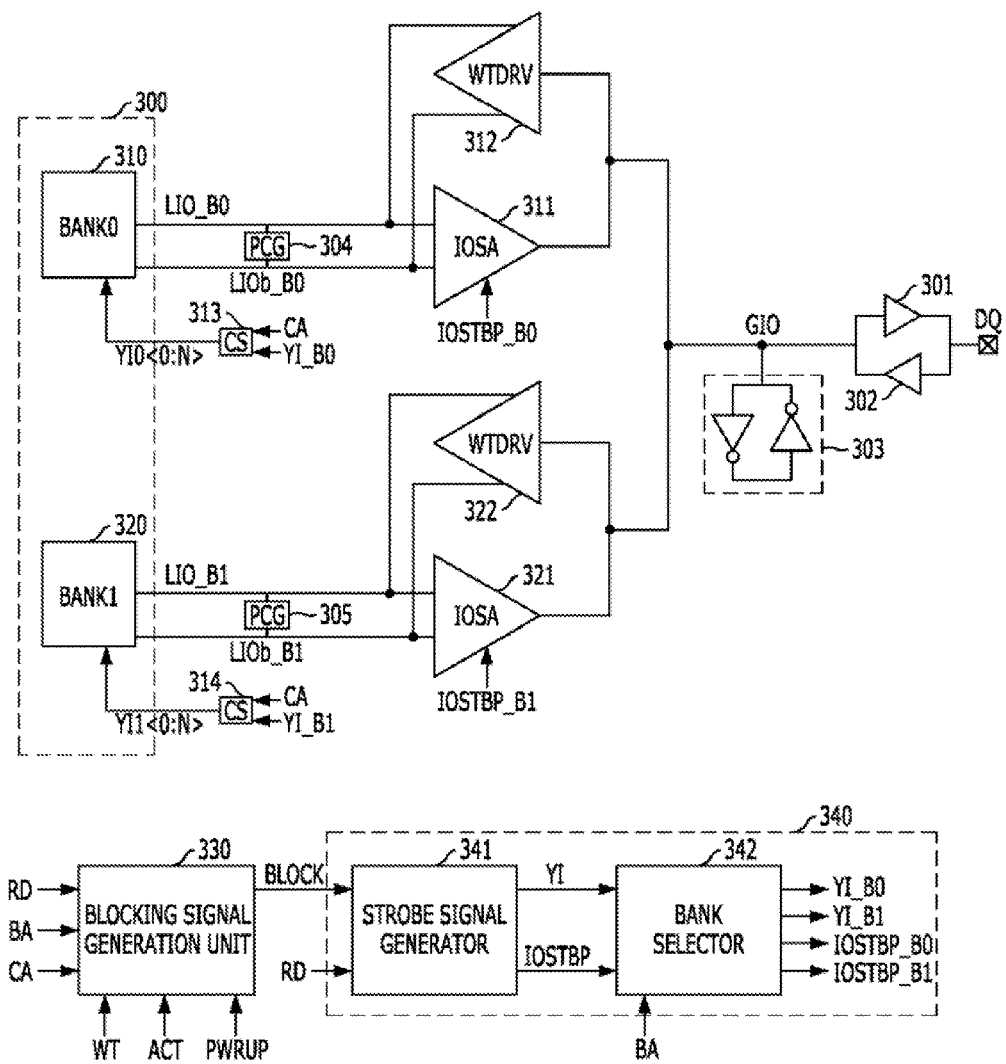
FIG. 3 is a block diagram illustrating a memory device in accordance with an embodiment of the present invention.

FIG. 3 is a block diagram illustrating a memory device in accordance with an embodiment of the present invention.

Referring to FIG. 3, the memory device may include a memory array 300, data buses LIO_B0, LIOb_B0, LIO_B1, LIOb_B1, and GIO, a blocking signal generation unit 330, a data transmission control unit 340, write drivers 312 and 322, I/O sense amplifiers 311 and 321, a latch 303, precharge units 304 and 305, column selection units 313 and 314, a transmitter 301, and a receiver 302.

The memory array 300 denotes an array of memory cells to store data. The memory array 300 may be classified into a plurality of memory banks 310 and 320. Each of the memory banks 310 and 320 may include a plurality of memory cells. FIG. 3 illustrates that the memory array 300 includes two memory banks 310 and 320. However, the memory array 300 may include a larger number of memory banks, for example, 8 memory banks and 16 memory banks).

The data buses LIO_B0, LIOb_B0, LIO_B1, LIOb_B1, and GIO may transmit read data from the memory banks 310 and 320 to a data pad DQ during a read operation, or transmit write data from the data pad DQ to the memory banks 310 and 320 during a write operation. The data buses may include local data buses LIO_B0, LIOb_B0, LIO_B1, and LIOb_B1 corresponding to the respective memory banks 310 and 320 and a global data bus GIO shared by the memory banks 310 and 320. The global data bus GIO may be coupled to a local data bus pair of a selected memory bank between the memory banks 310 and 320 during a read operation or a write operation. For example, during a read operation on the memory bank 310, the global data bus GIO may be coupled to the local data bus pair LIO_B0 and LIOb_B0, and during a write operation on the memory bank 320, the global data bus GIO may be coupled to the local data bus pair LIO_B1 and LIOb_B1. The local data buses LIO_B0, LIOb_B0, LIO_B1 and LIOb_B1 may transmit data in a differential manner, and the global data bus GIO may transmit data in a single ended manner. However, the transmission method may be changed depending on design. FIG. 3 illustrates that the data buses LIO_B0, LIOb_B0, LIO_B1, LIOb_B1, and GIO are used for both of a read operation and a write operation. Depending on embodiments, however, data buses for a read operation and data buses for a write operation may be separately provided, especially, for the global data bus GIO.

The blocking signal generation unit 330 may determine whether or not a current address is equal to a previous address, when successive read commands are applied. That is, the blocking signal generation unit 330 may determine whether or not read operations are successively performed on the same memory cell. When read commands are successively applied and addresses corresponding to two successive read commands are equal to each other, the blocking signal generation unit 330 may activate a blocking signal BLOCK for blocking data transmission. The blocking signal generation unit 330 may receive a column address CA and a bank address BA, and may compare the received addresses. That is, the blocking signal generation unit 330 may determine whether or not a column address CA and a bank address BA inputted with a current read command are equal to those inputted with a previous read command. Since a row address is applied during an active operation before a read operation and a row may not be changed during successive read operations, the blocking signal generation unit 330 does not need to receive a row address. FIG. 3 illustrates that the present invention is applied to a memory device which receives a column address CA and a bank address BA during a read operation. Thus, the blocking signal generation unit 330 receives a column address CA and a bank address BA. When the present invention is applied to a memory device which also receives a row address during a read operation, the blocking signal generation unit 330 may receive a row address in addition to a column address CA and a bank address BA, and compare a row address corresponding to a current read operation and a row address corresponding to a previous read operation. For reference, when read commands are successively applied, it may mean that no command is applied between read commands applied to the memory device. The blocking signal generation unit 330 will be described in detail with reference to FIG. 5.

The data transmission control unit 340 may control data transmission from the memory array 300 to the data pad DQ through the data buses LIO_B0, LIOb_B0, LIO_B1, LIOb_B1, and GIO during a read operation. When the blocking signal BLOCK is activated, that is, when successive read operations are performed on the same memory cell, the data transmission control unit 340 may block the data transmission from the memory array 300 to the data buses LIO_B0, LIOb_B0 LIO_B1, LIOb_B1, and GIO.

The data transmission control unit 340 may include a strobe signal generator 341 and a bank selector 342. The strobe signal generator 341 may generate a column select source signal YI for determining the time point at which data is transmitted from the memory array 300 to the local data buses LIO_B0, LIOb_B0, LIO_B1, and LIOb_B1 and a strobe source signal IOSTBP for determining the time point at which data is transmitted from the local data buses LIO_B0, LIOb_B0, LIO_B1, and LIOb_B1 to the global data bus GIO, during a read operation in which an internal read command signal RD is activated. Since the data is transferred through a path including the memory array 300, the local data buses LIO_B0, LIOb_B0, LIO_B1, and LIOb_B1O, and the global data bus GIO, the column select source signal YI may be activated before the strobe source signal IOSTBP. The data transmission control unit 340 sequentially activates the column select source signal VI and the strobe source signal IOSTBP whenever the internal read command signal RD is activated. However, when the blocking signal BLOK is activated, the data transmission control unit 340 may not activate the column select source signal VI and the strobe source signal IOSTBP even though the internal read command signal RD is activated. When the column select source signal YI and the strobe source signal IOSTBP are not activated, the data transmission from the memory array 300 to the data buses LIO_B0, LIOb_B0, LIO_B1, LIOb_B1, and GIO may be blocked.

The bank selector 342 may receive the bank address BA, the column select source signal YI, and the strobe source signal IOSTBP, and generate bank column select signals YI_B0 and YI_B1 and strobe signals IOSTBP_B0 and IOSTBP_B1. The bank selector 342 may activate a bank column select signal of a bank selected by the bank address BA when the column select source signal YI is activated, and activate a strobe signal of a bank selected when the strobe source signal IOSTBP is activated. For example, when the memory bank 320 is selected by the bank address BA, the bank column select signal YI_B1 may be activated when the column select source signal YI is activated, and the strobe signal IOSTBP_B1 may be activated when the strobe source signal IOSTBP is activated.

The column selection unit 313 may receive the bank column select signal YI_B0 and the column address CA and may generate column select signals YI0<0:N>. The column selection unit 313 may activate a column select signal corresponding to a column selected by the column address CA among the column select signals YI0<0:N> when the bank column select signal YI0 is activated. Inside the memory bank 310, data may be transmitted to the local data bus pair LIO_B0 and LIOb_B0 from a column corresponding to an activated column select signal among the column select signals YI0<0:N>. Similarly, the column selection unit 314 may activate a column select signal corresponding to a column selected by the column address among the column select signals YI1<0:N> when the bank column select signal YI_B1 is activated.

The I/O sense amplifier 311 may drive the data of the local data bus pair LIO_B0 and LIOb_B0 to the global data bus GIO in response to activation of the strobe signal IOSTBP_B0. Similarly, the I/O sense amplifier 321 may drive the data of the local data bus pair LIO_B1 and LIOb_B1 to the global data bus GIO in response to activation of the strobe signal IOSTBP_B1. The write driver 312 may drive the data of the global data bus GIO to the local data bus pair LIO_B0 and LIOb_B0 during a write operation on the memory bank 310, and the write driver 322 may drive the data of the global data bus GIO to the local data bus pair LIO_B1 and LIOb_B1 during a write operation on the memory bank 320.

The transmitter 301 may output data of the global data bus GIO to the outside of the memory device through the data pad DQ during a read operation. Furthermore, the receiver 302 may receive data inputted through the data pad DQ from the outside of the memory device and transmit the received data to the global data bus GIO during a write operation.

The precharge units 304 and 305 may be used to precharge the local data buses LIO_B0, LIOb_B0, LIO_B1, and LIOb_B1 to the level of a precharge voltage during a section in which the local data buses LIO_B0, LIOb_B0, LIO_B1, and LIOb_B1 are not used, that is, during a period between read (or write) operations. The latch 303 may prevent an unstable state of the global data bus GIO, that is, floating of the global data bus GIO. The latch 303 may allow the global data bus GIO to maintain (or latch) previous data. Thus, when successive read operations are performed on the same memory cell, the read operations may be performed even though data are not transmitted from the memory array 300.

Now, data transmission in the memory device during a general read operation and data transmission during successive read operations on the same memory cell will be described as follows.

(1) Data Transmission During General Read Operation

During a general read operation, the blocking signal BLOCK is deactivated, and the bank column select signals YI_B0 and YI_B1 and the strobe signals IOSTBP_B0 and IOSTBP_B1 may be normally generated by the data transmission control unit 340. Thus, data transmission may be performed through a path including the memory array 300, the local data buses LIO_B0, LIOb_B0, LIO_B1, and LIOb_B1, the global data bus GIO, and the transmitter 301. For example, when the memory bank 310 is selected to perform a read operation, data of a column selected in the memory bank 310 are loaded onto the local data bus pair LIO_B0 and LIOb_B0, the data of the local data bus pair LIO_B0 and LIOb_B0 is loaded onto the global data bus GIO by the I/O sense amplifier 311, and the data of the global data bus GIO may be outputted to the outside of the memory device through the transmitter 301.

(2) Data Transmission During Successive Read Operations on the Same Memory Cell

When successive read operations are performed on the same memory cell, that is when read commands are successively applied and addresses corresponding to two successive read commands are equal to each other, the blocking signal generation unit 230 may activate the blocking signal BLOK. When the blocking signal BLOCK is activated, the data transmission control unit may not activate the bank column select signals YI_B0 and YI_B1 and the strobe signals IOSTBP_B0 and IOSTBP_B1. Thus, the data transmission from the memory array 300 to the local data buses LIO_B0, LIOb_B0, LIO_B1, and LIOb_B1 and the data transmission from the local data buses LIO_B0, LIOb_B0, LIO_B1, and LIOb_B1 to the global data bus GIO are not performed. Furthermore, data loaded in the global data bus GIO may be outputted to the outside of the memory device through the transmitter 301. In this case, since a column (bit line) selected in the memory array 300 is not coupled to the local data buses LIO_B0, LIOb_B0, LIO_B1, and LIOb_B1, a fail caused by the successive read operations on the same memory cell may be prevented.

Figure 4:
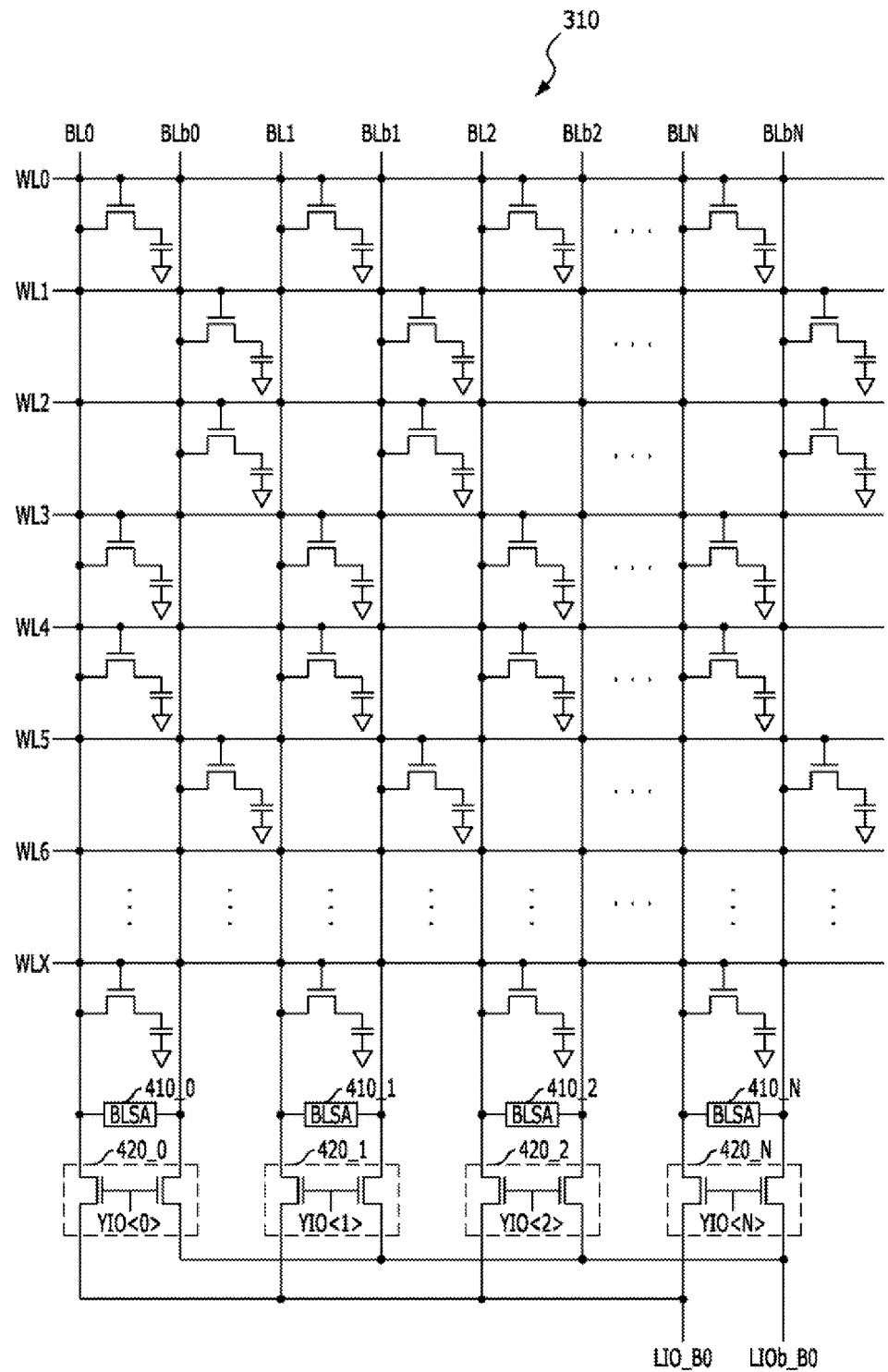
FIG. 4 is a detailed diagram of a memory bank shown in FIG. 3.

FIG. 4 is a detailed diagram of the memory bank 310 shown in FIG. 3. The memory bank 320 may also be configured in the same manner as the memory bank 310.

Referring to FIG. 4, the memory bank 310 may include a plurality of word lines WL0 to WLX and a plurality of bit line pairs BL0/BLb0 to BLN/BLbN. Furthermore, the memory bank 310 may include a plurality of memory cells corresponding to a value obtained by multiplying the number of word lines by the number of bit line pairs ((X+1)*(N+1)). Each of the memory cells may include a cell capacitor for storing data and an access transistor for controlling coupling between the capacitor and a bit line. Furthermore, the memory bank 310 may include bit line sense amplifiers 410_0 to 410_N for amplifying data of the bit line pairs BL0/BLb0 to BLN/BLbN and switches 420_0 and 420_N for transmitting data of a selected bit line pair to a local data bus pair.

When one of the word lines WL0 to WLX is activated during an active operation, data of memory cells corresponding to the activated word line may be transmitted to the bit line pairs BL0/BLb0 to BLN/BLbN. Furthermore, the data transmitted to the bit line pairs BL0/BLb0 to BLN/BLbN may be sensed and amplified by the bit line sense amplifiers 410_0 to 410_N. For example, when the word line WL3 is activated, data of memory cells coupled to the word line WL3 may be transmitted to the bit line pairs BL0/BLb0 to BLN/BLbN, and amplified by the bit line sense amplifiers 410_0 to 410_N.

When one of the column select signals YIO<0:N> is activated during a read operation, a corresponding switch among the switches 420_0 to 420_N may be turned on to transmit data of a corresponding bit line pair to a local data bus pairs That is, when a column select signal is activated, a switch may be turned on to transmit the data of a corresponding bit line pair to a local data bus pair. As a result, the data of memory cells corresponding to a word line selected during an active operation and a bit line pair selected during a read operation may be transmitted to a local data bus pair LIO_B0 and LIOb_B0.

Figure 5:
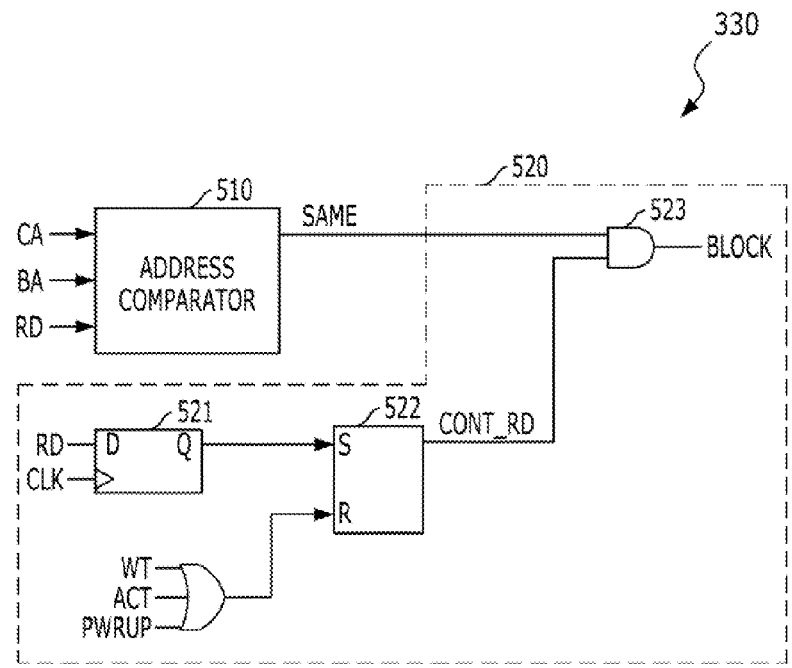
FIG. 5 is a detailed diagram of a blocking signal generation unit shown in FIG. 3.

FIG. 5 is a detailed diagram of the blocking signal generation unit 330 shown in FIG. 3.

Referring to FIG. 5, the blocking signal generation unit 330 may include an address comparator 510 and a block signal generator 520.

The address comparator 510 may compare the bits of addresses BA and CA corresponding to a previous read command to those corresponding to a current read command, respectively, and activate an identity signal SAME when all of the bits are equal to each other. The address comparator 510 only determines whether or not the addresses BA and CA corresponding to the current read command are identical to the addresses BA and CA corresponding to the previous read command, and does not determine whether or not another command is applied between the previous read command and the current read command, that is, whether or not the current read command succeeds the previous read command.

The block signal generator 520 may be configured to activate the blocking signal BLOCK when the identity signal SAME is activated and successive read operations are performed. The block signal generator 520 may include a D flip-flop 521, an SR latch 522, and an AND gate 523. The D flip-flop 521 may be configured to synchronize an internal read signal RD, which is activated when a read command is applied, with a clock CLK. The SR latch 522 may be configured to activate a successive read signal CONT_RD in response to activation of an output signal of the D flip-flop 521, and deactivate the successive read signal CONT_RD in response to a power-up signal PWRUP, an internal active signal ACT, and an internal write signal WT. Thus, the successive signal CONT_RD may be activated during a read operation, but deactivated when one of a power-up operation, an active operation, and a write operation is performed after the activation. That is, the successive read signal CONT_RD may be deactivated when successive read operations are not performed. The AND gate 523 may be configured to activate the blocking signal BLOCK when both of the successive read signal CONT_RD and the identity signal SAME are activated.

In short, the blocking signal BLOCK is activated when read operations are successively performed without other operations and addresses corresponding to the successive read operations are equal to each other.

Figure 6:
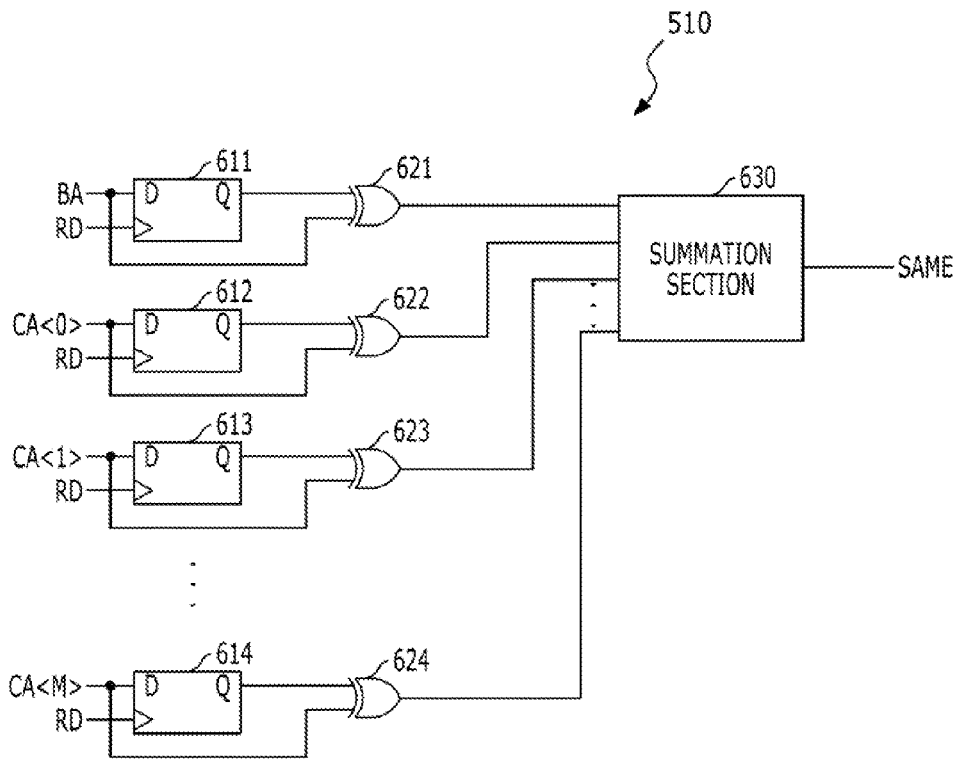
FIG. 6 is a detailed diagram of an address comparator shown in FIG. 5.

FIG. 6 is a detailed diagram of the address comparator 510 shown in FIG. 5.

Referring to FIG. 6, the address comparator 510 may include a plurality of D flip-flops 611 to 614, a plurality of XOR gates 621 to 624, and a summation section 630.

The D flip-flops 611 to 614 may receive (or latch) the respective bits of addresses BA and CA<0:m> in synchronization with the internal read signal RD. The addresses BA and CA<0:m> inputted to the D flip-flops 611 to 614 may include addresses inputted with a current read command, and the addresses stored in the D flip-flops 611 to 614 may include addresses inputted with a previous read command. FIG. 6 illustrates that the bank address BA includes one bit and the column address CA<0:m> includes (m+1) bits. However, the bit numbers of the addresses may be changed depending on designer.

The XOR gates 621 to 624 may compare the bits of the previous addresses outputted from the D flip-flops 611 to 614 to the bits of the current addresses BA and CA<0:m> inputted to the D flip-flops 611 to 614, respectively. Furthermore, the summation section 630 may add the comparison results of the XOR gates 621 to 624 and generate the identity signal SAME. Specifically, the summation section 630 may activate the identity signal SAME when the comparison results of all of the XOR gates 621 to 624 indicate that the previous addresses have the same bits as the current addresses.

Figure 7:
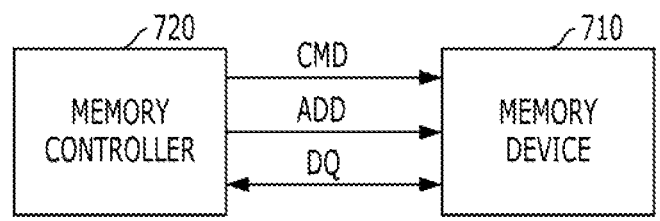
FIG. 7 is a block diagram illustrating a memory system in accordance with an embodiment of the present invention.

FIG. 7 is a block diagram illustrating a memory system in accordance with an embodiment of the present invention.

Referring to 7, the memory system may include a memory device 710 described with reference to FIGS. 3 to 6 and a memory controller 720.

The memory controller 720 may apply a command CMD and an address ADD to the memory device 710, and control the operation on the memory device 710 while exchanging data DQ with the memory device 710. The operation of the memory device 710 controlled by the memory controller 720 may include an active operation, a read operation, a write operation and the like. The address ADD applied to the memory device 710 by the memory controller 720 may include a bank address and a normal address. The normal address may be recognized as a row address when the normal address is applied with a row-related command, for example, an active command, and recognized as a column address when the normal address is applied with a column-related command, for example, a read or write command.

When the memory controller 720 applies a read command to the memory device 710 data may be read from the memory array 300 of the memory device 710 and transmitted to the memory controller 720. However, when the memory controller 720 successively applies read commands to the memory device 710 and addresses ADD corresponding to two successive read commands are the same as each other, data may not be read from the memory array 300 of the memory device 710, but data loaded in a data bus of the memory device 710 may be transmitted to the memory controller 720.

In accordance with the embodiments of the present invention, even when successive read operations are performed on the same memory cell in the memory device a fail may be prevented.

Although various embodiments have been described for illustrative purposes, it will be apparent to those skilled in the art that various changes and modifications may be made without departing from the spirit and scope of the invention as defined in the following claims.

What is claimed:

1. A memory device comprising:
 a memory array;
 a transmitter suitable for outputting data to the outside of the memory device; and
 a data bus suitable for transmitting data of a selected memory cell in the memory array to the transmitter during a read operation,
 wherein when successive read commands for the same memory cell are applied, data transmission from the memory array to the data bus is blocked, and data previously loaded in the data bus is outputted through the transmitter.

2. The memory device of claim 1, further comprising:
 a blocking signal generation unit suitable for determining whether or not a current address is equal to a previous address, when the successive read commands are applied; and
 a data transmission control unit suitable for controlling data transmission so that data of a memory cell selected in the memory array is transmitted to the transmitter through the data bus during the read operation, and blocking the data of the selected memory cell from, being loaded onto the data bus when the blocking signal generation unit determines that the two addresses are equal to each other.

3. The memory device of claim 2, wherein the memory array comprises memory banks each comprising a plurality of memory cells.

4. The memory device of claim 3, wherein the previous address and the current address, which are compared by the blocking signal generation unit, each comprise a bank address and a column address.

5. The memory device of claim 2, wherein the blocking signal generation unit comprises:
 an address comparator suitable for comparing the respective bits of a current address corresponding to a current read command to the bits of a previous address corresponding to a previous read command, and outputting an identity signal activated when the current and previous addresses are the same as each other;
 a block signal generator suitable for activating a blocking signal to block the data of the selected memory cell from being loaded to the data bus, when the identity signal is activated during successive read operations.

6. The memory device of claim 5, wherein the address comparator comprises:
 a plurality of D flip-flops suitable for latching the respective bits of the second address in synchronization with an internal read signal corresponding to the current read command;
 a plurality of XOR gates suitable for comparing the bits of the current address to the bits of the previous address outputted from the D flip-flops, respectively; and
 a summation section suitable for adding comparison results of the XOR gates and generating the identity signal.

7. The memory device of claim 6, wherein the block signal generator comprises:
 a D flip-flop suitable for synchronizing the internal read signal with a clock;
 an SR latch suitable for generating the successive read signal activated in response to the synchronized internal read signal outputted from the D flip-flop and deactivated in response to a power-up signal an internal active signal, and an internal write signal; and
 an AND gate suitable for activating the blocking signal when the successive read signal and the identity signal are activated.

8. The memory device of claim 1, further comprising:
 a latch coupled to the data bus and suitable for latching the data previously loaded onto the data bus.

9. A system including a memory controller and memory device,
 wherein the memory controller transmits a read command and an address corresponding to the read command to the memory device, and
 wherein the memory device comprises:
 a memory array;
 a transmitter suitable for outputting data to the memory controller; and
 a data bus suitable for transmitting data of a selected memory cell in the memory array to the transmitter during the read operation by the read command, and
 wherein, when the memory controller successively applies read commands with the same address, data transmission from the memory array to the data bus is blocked, and data loaded in the data bus is transmitted through the transmitter.

10. The system of claim 9, wherein the memory device further comprises:
 a blocking signal generation unit suitable for determining whether or not a current address is equal to a previous address, when the successive read commands are applied; and
 a data transmission control unit suitable for controlling data transmission such that data of a memory cell selected in the memory array is transmitted to the transmitter through the data bus during the read operation, and blocking the data of the selected memory cell from being loaded onto the data bus when the blocking signal generation unit determines that the two addresses are equal to each other.

11. The system of claim 10, wherein the blocking signal generation unit comprises:
 an address comparator suitable for comparing the respective bits of a current address corresponding to a current read command to the bits of a previous address corresponding to a previous read command, and outputting an identity signal activated when the current and previous addresses are the same as each other;
 a block signal generator suitable for activating a blocking signal to block the data of the selected memory cell from being loaded to the data bus, when the identity signal is activated during successive read operations.

12. The system of claim 9, wherein the memory device further comprises:
 a latch coupled to the data bus and suitable for latching the data previously loaded onto the data bus.

13. A memory device comprising:
a memory array with memory banks each including a plurality of memory cells;
local data buses corresponding to the respective memory banks;
a transmitter suitable for outputting data to the outside of the memory device; and
a global data bus suitable for transmitting data of a local data bus corresponding to a selected memory bank to the transmitter, during a read operation;
a blocking signal generation unit suitable for generating a blocking signal denoting a current address is equal to a previous address when two successive read commands are applied; and
a data transmission control unit suitable for controlling data transmission based on the current address and the blocking signal,
wherein, when the blocking signal is activated, the data loaded previously in the global data bus is transmitted to the transmitter as a read data during the read operation, while blocking data of the selected memory bank from being loaded onto the corresponding local data bus.

14. The memory device of claim 13, wherein the previous address and the current address, which are compared by the blocking signal generation unit, each comprise a bank address and a column address.

15. The memory device of claim 13, wherein the blocking signal generation unit comprises:
an address comparator suitable for comparing the respective bits of a current address corresponding to a current read command to the bits of a previous address corresponding to a current read command, and outputting an identity signal activated when the current and previous addresses are the same as each other; and
a block signal generator suitable for activating a blocking signal to block the data of the selected memory cell from being loaded to the data bus, when the identity signal is activated during successive read operations.

16. The memory device of claim 15, wherein the address comparator comprises:
a plurality of D flip-flops suitable for latching the respective bits of the second address in synchronization with an internal read signal corresponding to the current read command;
a plurality of XOR gates suitable for comparing the bits of the current address to the bits of the previous address outputted from the D flip-flops, respectively; and
a summation section suitable for adding comparison results the XOR gates and generating the identity signal.

17. The memory device of claim 16, wherein the block signal generator comprises:
a D flip-flop suitable for synchronizing the internal read signal with a clock;
an SR latch suitable for generating the successive read signal activated in response to the synchronized internal read signal outputted from the D flip-flop and deactivated in response to a power-up signal, an internal active signal, and an internal write signal; and
an AND gate suitable for activating the blocking signal when the identity signal and the successive read signal are activated.

18. The memory device of claim 13, further comprising:
a latch coupled to the global data bus and suitable for latching the data previously loaded onto the global data bus.

* * * * *